(12) United States Patent
Wang (10) Patent No.: US 10,878,931 B2
(45) Date of Patent: Dec. 29, 2020

(54) GATE DRIVER CIRCUIT, LEVEL SHIFTER, AND DISPLAY APPARATUS

(71) Applicants: Chongqing HKC Optoelectronics Technology Co., Ltd., Chongqing (CN); HKC Corporation Limited, Guangdong (CN)

(72) Inventor: Mingliang Wang, Chongqing (CN)

(73) Assignees: Chongqing HKC Optoelectronics Technology Co., Ltd., Chongqing (CN); HKC Corporation Limited, Shenzhen (CN)

(*) Notice: Subject to any disclaimer, the term of this patent is extended or adjusted under 35 U.S.C. 154(b) by 5 days.

(21) Appl. No.: 16/257,083

(22) Filed: Jan. 25, 2019

(65) Prior Publication Data

US 2020/0090776 A1 Mar. 19, 2020

Related U.S. Application Data (63) Continuation of application No. PCT/CN2018/115121, filed on Nov. 13, 2018.

(30) Foreign Application Priority Data

Sep. 13, 2018 (CN) .......................... 2018 1 1072275

(51) Int. Cl.
*G11C 19/28* (2006.01)
*G09G 3/20* (2006.01)

(52) U.S. Cl.
CPC ............. *G11C 19/287* (2013.01); *G09G 3/20* (2013.01); *G09G 2300/0426* (2013.01);
(Continued)

(58) Field of Classification Search
CPC ................... G11C 19/287; G09G 3/20; G09G 2300/0426; G09G 2300/0871;
(Continued)

(56) References Cited

U.S. PATENT DOCUMENTS 9,934,749 B2     4/2018 Yu
2016/0275901 A1* 9/2016 Guo .......................... H04N 5/63
(Continued)

FOREIGN PATENT DOCUMENTS

CN     103400558 A    11/2013
CN     104934071 A     9/2015
(Continued)

*Primary Examiner* — Peter D McLoone (57) ABSTRACT

Disclosed are a gate driver circuit, a level shifter and a display apparatus. The gate driver circuit includes a potential enhancing unit, a switch unit, a current detecting unit, and a control unit. The potential enhancing unit is configured to divide a clock signal output by a timing sequence controller into two clock signal groups after the clock signal being potential enhanced, and correspondingly output the two clock signal groups to two shift register groups; the switch unit is configured to control to output or stop outputting the clock signal groups; the current detecting unit is configured to respectively detect output current of each sub-clock signal; the control unit is configured to compare current values corresponding to the plurality of current signals with a preset current threshold respectively, output a control signal to the switch unit.

18 Claims, 4 Drawing Sheets

(52) U.S. Cl.
CPC ........... *G09G 2300/0871* (2013.01); *G09G 2310/0286* (2013.01); *G09G 2310/0289* (2013.01); *G09G 2310/08* (2013.01)

(58) Field of Classification Search
CPC ... G09G 2310/0286; G09G 2310/0289; G09G 2310/08
See application file for complete search history.

(56) References Cited

U.S. PATENT DOCUMENTS

2017/0270886 A1    9/2017  Yu
2019/0080659 A1*  3/2019  Zhang ................. G09G 3/3677

FOREIGN PATENT DOCUMENTS

| CN | 106057106 A | 10/2016 |
|---|---|---|
| CN | 107025870 A | 8/2017 |
| CN | 107395006 A | 11/2017 |
| CN | 108109566 A | 6/2018 |

* cited by examiner

GATE DRIVER CIRCUIT, LEVEL SHIFTER, AND DISPLAY APPARATUS

CROSS REFERENCE TO RELATED APPLICATIONS

The present application is a Continuation Application of PCT Application No. PCT/CN2018/115121 filed on Nov. 13, 2018, which claims the benefit of Chinese Patent Application No. 201811072275.0, filed on Sep. 13, 2018, which is incorporated herein by reference in its entirety.

FIELD

The present disclosure relates to the field of display panel technology, and more particularly relates to a gate driver circuit, a level shifter, and a display apparatus.

BACKGROUND

With the increasing demand for narrow-border televisions, a new type of gate driver on array driver (GOA) architecture is getting more and more popular. In the general display panel, a gate IC is bound on a panel, thus, a further narrowing of the border would be limited by the size of the gate IC. In recent years, with the advent of the new type of GOA technology, the traditional driving way has been gradually replaced. The GOA circuit is a circuit in which the original Gate IC is divided into two parts including a level shifter chip (level shifter IC) and a shift register. The level shifter chip is manufactured on the driver board, and the shift register is on the panel. The level shifter chip transmits CLK to the shift register for driving. As such, the structure of the Gate IC is simplified, and further, the border length is reduced.

In the manufacture process of the GOA, shift registers are provided on both the left and right sides of the panel, so as to implement bilateral driving. Considering that instability may occur in the manufacture process, and damage may be caused to one shift register during operation, an abnormal display may be generated. Because there is a probability for the shift register on either side to be damaged, it is impossible to fix one of the driving ways. Currently, three driver boards are developed in one panel, which are respectively used to drive the shift register on left side only, the shift register on the right side only, and the shift registers on both the left and right sides. It is passively determined that which driver board works according to actual damage status of the shift register, which is costly, laborious and time-consuming.

SUMMARY

It is one main objective of the present disclosure to provide a gate driver circuit, aiming to improve compatibility of the driver board, and reduce design costs.

In order to realize the above aim, the present disclosure provides a gate driver circuit, the gate driver circuit includes:

a potential enhancing unit, configured to divide a clock signal output by a timing sequence controller into two clock signal groups after the clock signal being potential enhanced by the potential enhancing unit, and correspondingly output the two clock signal groups to two shift register groups on a display panel, to drive the display panel to work; the two clock signal groups respectively comprising at least one sub-clock signal;

a switch unit, connected in series between the potential enhancing unit and the shift registers located at both ends of the display panel, and configured to correspondingly switch on or off according to a control signal received, to control to output or stop outputting the clock signal groups;

a current detecting unit, connected in series between the potential enhancing unit and the switch unit, or in series between the switch unit and the shift registers located at both ends of the display panel, configured to respectively detect output current of each sub-clock signal in the two clock signal groups, and feed back a plurality of current signals to the control unit; and a control unit, configured to receive the plurality of current signals output by the current detecting unit, and compare current values corresponding to the plurality of current signals with a preset current threshold respectively, when the current value of any one of the sub-clock signals in one of the clock signal groups is less than the preset current threshold, output a control signal to the switch unit, to control the switch unit to cut off the output of the clock signal group.

Optionally, a signal input end of the potential enhancing unit connects to a signal output end of the timing sequence controller, a signal output end of the potential enhancing unit connects to a signal input end of the current detecting unit, a signal output end of the current detecting unit connects to a signal input end of the switch unit, a first signal output end of the switch unit connects to a signal input end of the first shift register group of the display panel, a second signal output end of the switch unit connects to a signal input end of the second shift register group of the display panel, a controlled end of the potential enhancing unit, the signal output end of the current detecting unit, and a controlled end of the switch unit all connect to a signal end of the control unit.

Optionally, the switch unit comprises a first sub-switch unit and a second sub-switch unit, the potential enhancing unit output two identical clock signal groups to the shift register located at both ends of the display panel, respectively via the first sub-switch unit and the second sub-switch unit, the controlled end of the first sub-switch unit and the controlled end of the second sub-switch unit both connect to a control end of the control unit.

Optionally, the switch unit comprises a plurality of sub-switch units, each of sub-clock signals is output to the shift registers via each of the sub-switch units, and the controlled end of each of the sub-switch units respectively connects to a control end of the control unit.

Optionally, the plurality of sub-switch units defined between the current detecting unit and the first shift register are linked, and the plurality of sub-switch units defined between the current detecting unit and the second shift register are linked.

Optionally, each of the sub-switch units is a metal-oxide semiconductor field effect transistor.

Optionally, each of the sub-switch units is a triode.

Optionally, the current detecting unit comprises a plurality of sub-current detecting units, each of the sub-current detecting units respectively detects current of each of the sub-clock signals, and respectively feeds back current signal to the control unit.

The present disclosure further provides a level shifter, which includes the gate driver circuit as described above. The gate driver circuit includes:

a potential enhancing unit, configured to divide a clock signal output by a timing sequence controller into two clock signal groups after the clock signal being potential enhanced by the potential enhancing unit, and correspondingly output the two clock signal groups to two shift register groups on a display panel, to drive the display panel to work; the two clock signal groups respectively comprising at least one sub-clock signal;

a switch unit, connected in series between the potential enhancing unit and the shift registers located at both ends of the display panel, and configured to correspondingly switch on or off according to a control signal received, to control to output or stop outputting the clock signal groups;

a current detecting unit, connected in series between the potential enhancing unit and the switch unit, or in series between the switch unit and the shift registers located at both ends of the display panel, configured to respectively detect output current of each sub-clock signal in the two clock signal groups, and feed back a plurality of current signals to the control unit; and a control unit, configured to receive the plurality of current signals output by the current detecting unit, and compare current values corresponding to the plurality of current signals with a preset current threshold respectively, when the current value of any one of the sub-clock signals in one of the clock signal groups is less than the preset current threshold, output a control signal to the switch unit, to control the switch unit to cut off the output of the clock signal group.

Optionally, a signal input end of the potential enhancing unit connects to a signal output end of the timing sequence controller, a signal output end of the potential enhancing unit connects to a signal input end of the current detecting unit, a signal output end of the current detecting unit connects to a signal input end of the switch unit, a first signal output end of the switch unit connects to a signal input end of the first shift register group of the display panel, a second signal output end of the switch unit connects to a signal input end of the second shift register group of the display panel, a controlled end of the potential enhancing unit, the signal output end of the current detecting unit, and a controlled end of the switch unit all connect to a signal end of the control unit.

Optionally, the switch unit comprises a first sub-switch unit and a second sub-switch unit, the potential enhancing unit output two identical clock signal groups to the shift register located at both ends of the display panel, respectively via the first sub-switch unit and the second sub-switch unit, the controlled end of the first sub-switch unit and the controlled end of the second sub-switch unit both connect to a control end of the control unit.

Optionally, the switch unit comprises a plurality of sub-switch units, each of sub-clock signals is output to the shift registers via each of the sub-switch units, and the controlled end of each of the sub-switch units respectively connects to a control end of the control unit.

Optionally, the plurality of sub-switch units defined between the current detecting unit and the first shift register are linked, and the plurality of sub-switch units defined between the current detecting unit and the second shift register are linked.

Optionally, each of the sub-switch units is a metal-oxide semiconductor field effect transistor.

Optionally, each of the sub-switch units is a triode.

Optionally, the current detecting unit comprises a plurality of sub-current detecting units, each of the sub-current detecting units respectively detects current of each of the sub-clock signals, and respectively feeds back current signal to the control unit.

Optionally, the potential enhancing unit, the current detecting unit, the switch unit, and the control unit are integrated in the level shifter.

The present disclosure further provides a display apparatus, which includes the level shifter as described above. The level shifter includes a gate driver circuit, the gate driver circuit includes:

a potential enhancing unit, configured to divide a clock signal output by a timing sequence controller into two clock signal groups after the clock signal being potential enhanced by the potential enhancing unit, and correspondingly output the two clock signal groups to two shift register groups on a display panel, to drive the display panel to work; the two clock signal groups respectively comprising at least one sub-clock signal;

a switch unit, connected in series between the potential enhancing unit and the shift registers located at both ends of the display panel, and configured to correspondingly switch on or off according to a control signal received, to control to output or stop outputting the clock signal groups;

a current detecting unit, connected in series between the potential enhancing unit and the switch unit, or in series between the switch unit and the shift registers located at both ends of the display panel, configured to respectively detect output current of each sub-clock signal in the two clock signal groups, and feed back a plurality of current signals to the control unit; and a control unit, configured to receive the plurality of current signals output by the current detecting unit, and compare current values corresponding to the plurality of current signals with a preset current threshold respectively, when the current value of any one of the sub-clock signals in one of the clock signal groups is less than the preset current threshold, output a control signal to the switch unit, to control the switch unit to cut off the output of the clock signal group.

In the technical solution of the present disclosure, the gate driver circuit is formed by the potential enhancing unit, the current detecting unit, the switch unit and the control unit.

Potential of a low level logic signal from a timing sequence controller is enhanced by the potential enhancing unit, and then divided into two clock signal groups in which each of the two clock signal groups includes at least one sub-clock signal. The two clock signal groups are output to two shift register on the display panel, so as to drive the display panel. Current value of each of the clock signals is detected by the current detecting unit, and then fed back to the control unit. When one of the shift registers on the display panel is damaged, the current of the clock signal output to the shift register is abnormal. The control unit correspondingly outputs a control signal to the switch unit, according to the current signal fed back by the current detecting unit, so as to switch off the clock signal output to the shift register, realizing unilateral driving. As such, different abnormal states of the shift registers located at both ends of the display panel could be dynamically matched, improving the compatibility of the driver board.

BRIEF DESCRIPTION OF THE DRAWINGS

In order to more clearly illustrate the embodiments of the present disclosure or the technical solutions in the prior art, the drawings used in the embodiments or the prior art description will be briefly introduced below. Obviously, the drawings in the following description are merely some of the embodiments of the present disclosure, and those skilled in the art can obtain other drawings according to the structures shown in the drawings without any creative work.

The realizing of the aim, functional characteristics and advantages of the present disclosure are further described in detail with reference to the accompanying drawings and the embodiments.

DETAILED DESCRIPTION OF THE EMBODIMENTS

The technical solutions in the embodiments of the present disclosure will be described clearly and completely combining the drawings in the embodiments of the present disclosure. Obviously, the described embodiments are only a part of the embodiments of the present disclosure, but not all of them. Based on the embodiments in the present disclosure, all other embodiments obtained by those skilled in the art without creative work shall belong to the protection scope of the present disclosure.

It should be noted that, terms such as "first" and "second" are used herein for purposes of description and are not intended to indicate or imply relative importance or to imply the number of indicated technical features. Thus, the features defined with "first" and "second" may comprise or imply at least one of these features. Moreover, the meaning of "and/or" appearing in the full text is: including three parallel solutions. Taking "A/B" as an example, it includes the A plan, or the B plan, or the plan satisfying A and B simultaneously. In addition, the technical solutions between the various embodiments of the present disclosure may be combined with each other, but must be based on the realization of those skilled in the art. When the combination of technical solutions is contradictory or impossible to implement, it should be considered that the combination of the technical solutions does not exist, and not within the scope of protection required by this disclosure.

Figure 1:
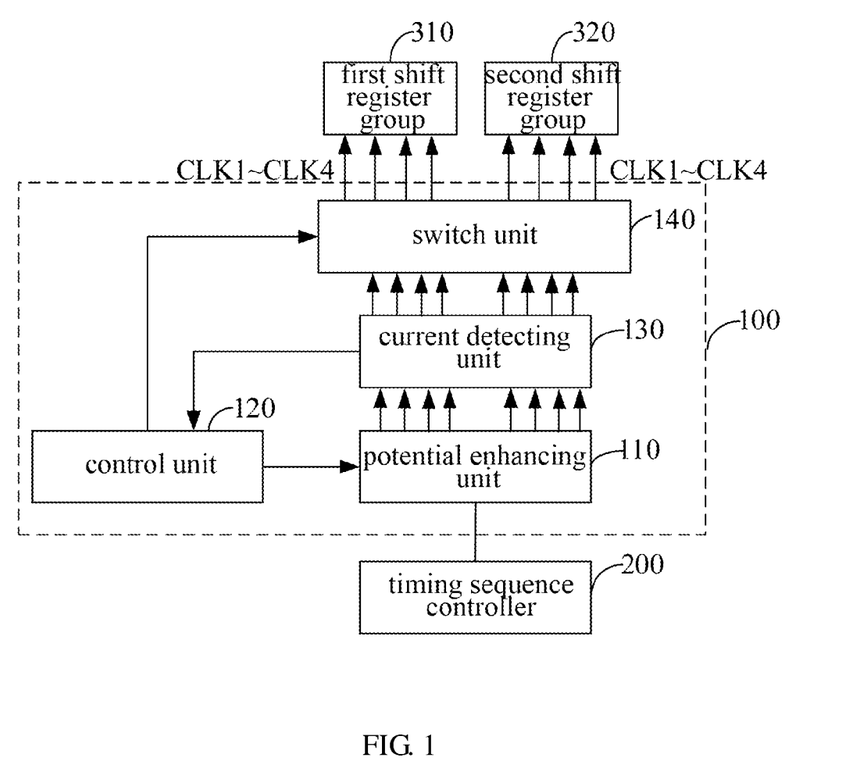
FIG. 1 is a functional module diagram of a gate driver circuit of an embodiment according to the present disclosure.

The gate driver circuit 100 of the present disclosure is configured to drive a small-size display panel. For a small-size display panel, the load of the gate line is small, therefore, a bilateral driving or a unilateral driving could be adopted. As shown in FIG. 1, FIG. 1 is a functional module diagram of a gate driver circuit of an embodiment according to the present disclosure, the gate driver circuit 100 includes:

a potential enhancing unit 110, configured to divide a clock signal output by a timing sequence controller 200 into two clock signal groups after the clock signal being potential enhanced by the potential enhancing unit 100, and correspondingly output the two clock signal groups to two shift register groups on a display panel, to drive the display panel to work; the two clock signal groups respectively comprising at least one sub-clock signal;

a switch unit 140, connected in series between the potential enhancing unit 110 and the shift registers located at both ends of the display panel, and configured to correspondingly switch on or off according to a control signal received, to control to output or stop outputting the clock signal groups;

a current detecting unit 130, connected in series between the potential enhancing unit 110 and the switch unit 140, or in series between the switch unit 140 and the shift registers located at both ends of the display panel, configured to respectively detect output current of each sub-clock signal in the two clock signal groups, and feed back a plurality of current signals to the control unit 120; and a control unit 120, configured to receive the plurality of current signals output by the current detecting unit 130, and compare current values corresponding to the plurality of current signals with a preset current threshold respectively, when the current value of any one of the sub-clock signals in one of the clock signal groups is less than the preset current threshold, output a control signal to the switch unit 140, to control the switch unit 140 cut off the output of the clock signal group.

In this embodiment, the display panel includes but not limited to a liquid display panel, an organic light emitting diode display panel, a field emission display panel, a plasma display panel, and a curved surface panel. The liquid display panel includes a thin film transistor liquid crystal display panel, a twisted nematic (TN) display panel, a vertical alignment (VA) display panel, an in-plane switching (IPS) display panel and so on. The shift registers disposed at both ends of the display panel receive the plurality of clock signals output by the gate driver circuit 100, and drive pixels inside the display panel to work. The clock signals respectively received by the two shift register groups are identical, and each clock signal is one cycle ahead of the previous clock signal.

It is assumed that the clock signals output by the gate driver circuit 100 to the two shift register groups are respectively CLK1 to CLK4, CLK2 is ¼ cycle ahead of CLK1, and CLK3 is ¼ cycle ahead of CLK2. The gate driver circuit 100 may output 6 sub-clock signals or 8 sub-clock signals according to requirements. By using more CLK signals, the load of each of signal lines and power consumption could be reduced, however, the number of pins in the circuit would be increased. In actual design, the number of clock signals output could be selected according to boarder width, product size, integrated circuit design, resolution of the specific product, and so on.

The potential enhancing unit 110 receives a low level clock signal output by the timing sequence controller 200, and shifts the level of the clock signal under the modulation of the control unit 120, so as to enhance the potential of the low level clock signal and output two identical clock signal groups. Each clock signal group includes at least one sub-clock signal, the number of the sub-clock signals could be determined according to requirements, for example, 4, 6, 8, and so on. The clock signal groups, which is output by the potential enhancing unit 110, are output to the two shift register groups located at both ends of the display panel through the current detecting unit 130, and the switch unit 140. The current detecting unit 130 respectively detects the current value of each of the sub-clock signals. The current detecting circuit may select a circuit such as a sampling resistor or a transformer, and so on, for current detection. The switch unit 140 may select a plurality of switch components or switch circuits with switching capability, such as relays, field effect transistors, triodes, and so on. In some embodiments, one switch controls the signal output of one clock signal group, or one switch controls the output of one sub-clock signal. A controlled end of the switch is connected to a control end of the control unit 120, and performs switch-on or switch-off according to the control signal output by the control unit 120. The control unit 120 may select a microprocessor, a programmable single chip microcomputer, and so on. And a comparator circuit could be build on the periphery for voltage comparison, and specifically arranged according to actual conditions. Thus, they are not limited herein.

In one optional embodiment, a signal input end of the potential enhancing unit 110 is connected to a signal output end of the timing sequence controller 200, a signal output end of the potential enhancing unit 110 is connected to a signal input end of the current detecting unit, a signal output end of the current detecting unit 130 is connected to a signal input end of the switch unit 140, a first signal output end of the switch unit 140 is connected to a signal input end of the first shift register group 310 of the display panel, a second signal output end of the switch unit 140 is connected to a signal input end of the second shift register group 320 of the display panel, a controlled end of the potential enhancing unit 110, the signal output end of the current detecting unit 130, and the controlled end of the switch unit 140 are all connected to a signal end of the control unit 120.

It should be noted that, the current detecting unit 130 may be disposed at the front end or the rear end of the switch unit 140, which could be specifically determined according to the position of the driver board. Thus, it is not limited herein. In this embodiment, the current detecting unit 130 is disposed at the front end of the switch unit 140, the signal output end of the switch unit 140 is respectively connected to the signal input ends of the two shift register groups. When the shift registers located at both ends of the display panel are normal, the bilateral driving is realized. When one of the shift register groups is damaged, all or a single sub-clock signal, correspondingly output to the shift register, could not be input normally, causing an abnormal driving. The current detecting unit 130 detects the value of the clock signal, and feeds back the current value of each sub-clock signal to the control unit 120. The control unit 120, according to a comparison between the current value with a preset current threshold, determines that the shift register is abnormal, and outputs the control signal to the switch unit 140. Correspondingly, the sub-switch unit 140 inside the switch unit 140 performs a switch-on or switch-off action, cuts off the clock signal group output to the shift register, so as to realize the unilateral driving. If the two shift register groups are both damaged, the two clock signal groups are both cut off, and the shift registers are to be repaired or replaced.

The gate driver circuit 100 may be configured to drive a small-size display panel. When the shift registers located at both ends of the display panel are normal, the bilateral driving is implemented; when one of the shift register groups has an abnormality, the unilateral driving is automatically switched to. The gate driver circuit 100 is mounted on the driver board, which could drive the left side, the right side, or both the left side and the right side. As such, there is no need to design three kinds of driver boards, improving the compatibility of the driver board, and reducing the design costs.

In the technical solution of the present disclosure, the gate driver circuit 100 is formed by the potential enhancing unit 110, the current detecting unit 130, the switch unit 140 and the control unit 120. The potential enhancing unit 110 enhances the potential of the clock signal output by the timing sequence controller 200, divides the clock signal into two clock signal groups, and correspondingly outputs the two clock signal groups to the two shift register groups on the display panel, to bilaterally drive the display panel. The current detecting unit 130 detects current value of each clock signal, then feeds back the current value to the control unit 120. When one of the shift register groups on the display panel is damaged, the current of the clock signal output to the shift register group is abnormal. The control unit 120 correspondingly outputs the control signal to the switch unit 140 according to the current signal fed back by the current detecting unit 130, so as to switch off the clock signal output to the shift register group, realizing the unilateral driving. As such, different abnormal states of the shift registers located at both ends of the display panel could be dynamically matched, improving the compatibility of the driver board.

Figure 2:
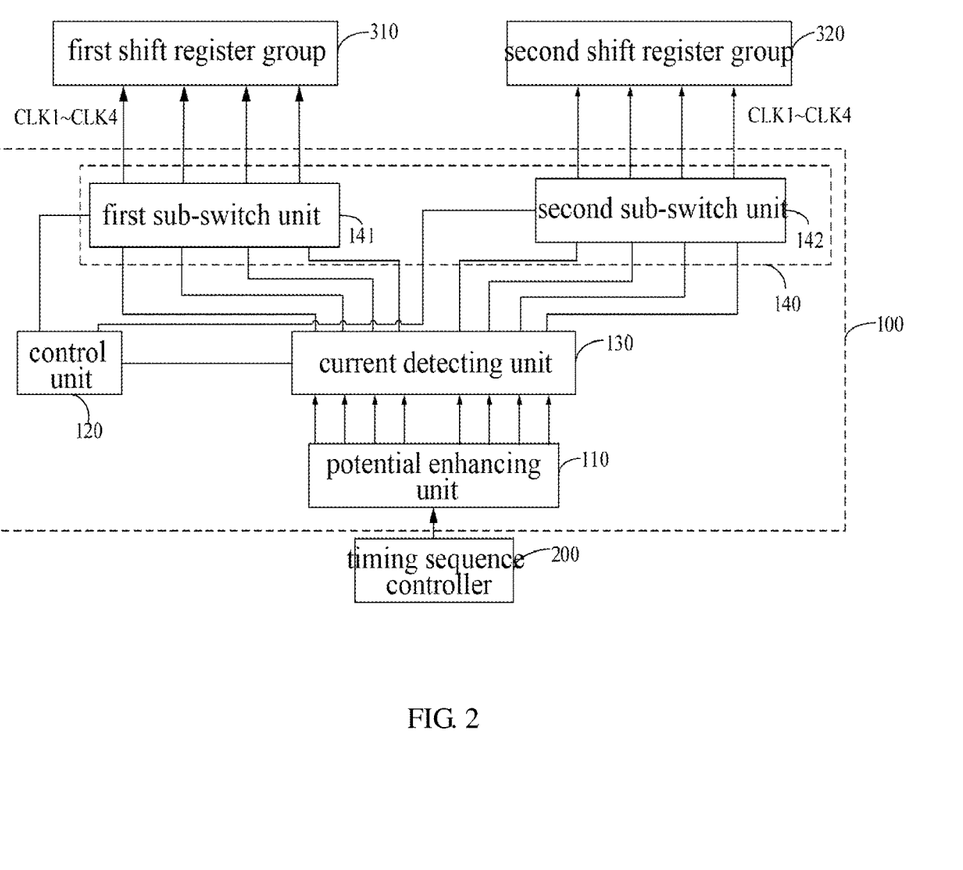
FIG. 2 is a functional module diagram of a gate driver circuit of another embodiment according to the present disclosure.

In one optional embodiment, as shown in FIG. 2, FIG. 2 is a functional module diagram of a gate driver circuit of another embodiment according to the present disclosure. The switch unit 140 includes a first sub-switch unit 141 and a second sub-switch unit 142. The potential enhancing unit 110 outputs two identical clock signal groups to the shift registers located at both ends of the display panel via the first sub-switch unit 141 and the second sub-switch unit 142, respectively. A controlled end of the first sub-switch unit 141 and a controlled end of the second sub-switch unit 142 are both connected to a control end of the control unit 120.

In this embodiment, the two clock signal groups are output to the corresponding shift register via the first sub-switch unit 141 and the second sub-switch unit 142, respectively. The first sub-switch unit 141 and the second sub-switch unit 142 simultaneously control the output of the plurality of sub-clock signals. Initially, the first sub-switch unit 141 and the second sub-switch unit 142 remain on status. When one of the two shift register groups is damaged, for example, the first shift register group 310, the current of the clock signal group output to the first shift register group 310 is abnormal. The abnormalities may include that, the current of one of the sub-clock signals is small, or the currents of multiple of the sub-clock signals are small. When the current value of any one of the sub-clock signals is smaller than the preset current threshold, the control unit 120 outputs the control signal to the first sub-switch unit 141, to switch off the first sub-switch unit 141, so as to cut off at least one sub-clock signal output to the first shift register group 310, therefore, the unilateral driving is implemented. Similarly, when the second shift register group 320 is damaged, the second sub-switch unit 142 is switched off.

The first sub-switch unit 140 and the second sub-switch unit 142 may use multiple-input and multi-output relays or other switch components, and could be designed according to actual conditions, which is not limited herein.

Figure 3:
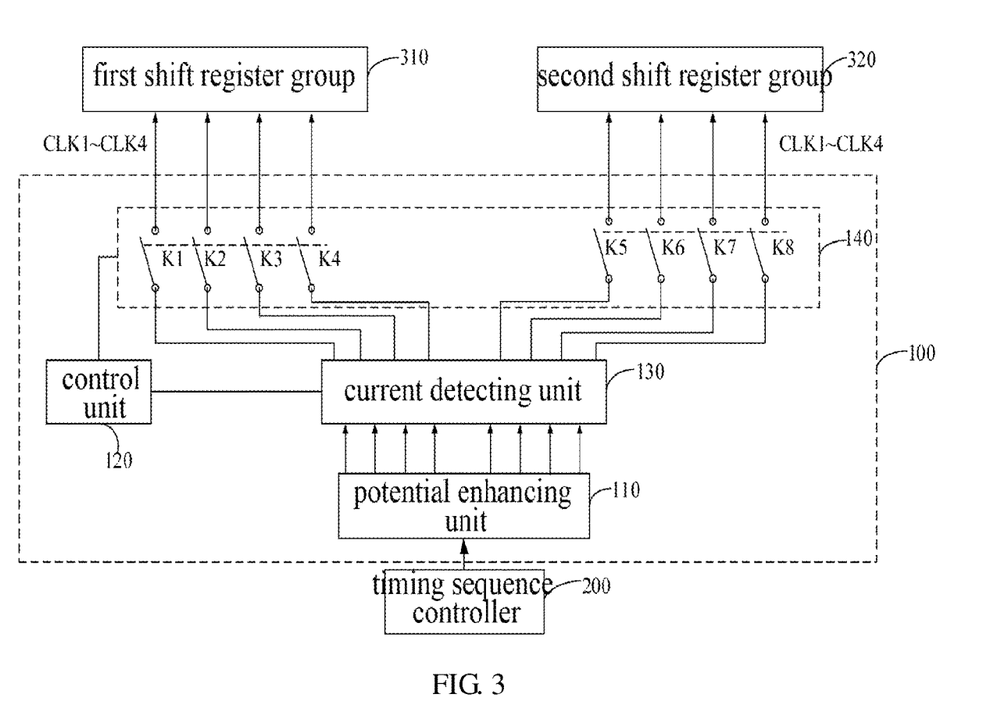
FIG. 3 is a functional module diagram of a gate driver circuit of another embodiment according to the present disclosure.

In one optional embodiment, as shown in FIG. 3, FIG. 3 is a functional module diagram of a gate driver circuit of another embodiment according to the present disclosure. The switch unit 140 includes a plurality of sub-switch units 140. Each of sub-clock signals is output to the shift registers via each of the sub-switch units 140, and the controlled end of each of the sub-switch units 140 respectively are connected to the control end of the control unit 120.

In this embodiment, the switch unit 140 includes a plurality of sub-switch units 140, such as K1 to K8. The sub-switch units 140 corresponds to the clock signals output by the potential enhancing unit 110 one by one. Each sub-switch unit 140 is connected in series between the current detecting unit 130 and the shift registers, and configured to control the output of each sub-clock signal. The plurality of sub-switch units 140 disposed between the current detecting unit 130 and the first shift register group 310 are linked. For example, K1 to K4 in FIG. 3 are switched on or off simultaneously; and the plurality of sub-switch units 140 disposed between the current detecting unit 130 and the second shift register 320 are linked. For example, K5 to K8 in FIG. 3 are switched on or off simultaneously, so as to realize a synchronous control of the plurality of sub-clock signals in the clock signal group, and realize an automatic switching between the bilateral driving and the unilateral driving under the control of the control unit 120.

Further, each sub-switch unit is a metal-oxide semiconductor field effect transistor.

When the number of the sub-switch units included in the switch unit 140 is equal to the number of the sub-clock signals, each sub-switch unit may use a metal-oxide semiconductor field effect transistor. The gate of the metal-oxide semiconductor field effect transistor is taken as the controlled end of the sub-switch unit, and connected to the control end of the control unit 120. The source or the drain of the metal-oxide semiconductor field effect transistor is connected to the signal output end of the current detecting unit 130, the drain or the source of the metal-oxide semiconductor field effect transistor is connected to the first shift register group 310 or the second shift register group 320. The metal-oxide semiconductor field effect transistor may be a n-channel metal-oxide semiconductor field effect transistor or a p-channel metal-oxide semiconductor field effect transistor. When the n-channel metal-oxide semiconductor field effect transistor is selected, the control unit 120 outputs a high level to the metal-oxide semiconductor field effect transistor to switch it on, and outputs a low level to the metal-oxide semiconductor field effect transistor to switch it off. When the p-channel metal-oxide semiconductor field effect transistor is selected, the control unit 120 outputs a low level to the metal-oxide semiconductor field effect transistor to switch it on, and outputs a high level to the metal-oxide semiconductor field effect transistor to switch it off. The type of the metal-oxide semiconductor field effect transistor could be flexibly selected, which is not limited herein.

Further, each sub-switch unit is a triode.

When the number of the sub-switch units included in the switch unit 140 is equal to the number of the sub-clock signals, each sub-switch unit may use a triode. The base of the triode is taken as the controlled end of the sub-switch unit and connected to the control end of the control unit 120, the collector or the emitter of the triode is connected to the signal output end of the current detecting unit 130, the emitter or the collector of the triode is connected to the signal input end of the corresponding shift register. The triode may be a NPN transistor or a PNP transistor. When the NPN transistor is selected, the control unit 120 outputs a high level to the NPN transistor to switch it on, and outputs a low level to switch it off. Accordingly, when the PNP transistor is selected, the control unit 120 outputs a low level to the PNP transistor to switch it on, and outputs a high level to switch it off. The type of triode could be flexibly selected, which is not limited herein.

In an optional embodiment, the current detecting unit 130 includes a plurality of sub-current detecting units. Each of the sub-current detecting units respectively detects the current of each of the sub-clock signals, and respectively feeds back current signal to the control unit 120.

It should be noted that, the plurality of sub-current detecting units are configured to detect the sub-clock signals output by the potential enhancing unit 110, the number of the sub-current detecting units is equal to the number of the sub-clock signals, and the sub-current detecting units corresponds to the sub-clock signals one by one. Each sub-current detecting unit detects the corresponding sub-clock signal and feeds back the current signal to the control unit 120. The sub-current detecting unit may perform current detection by a circuit, such as a current transformer, a sampling resistor and so on.

Figure 4:
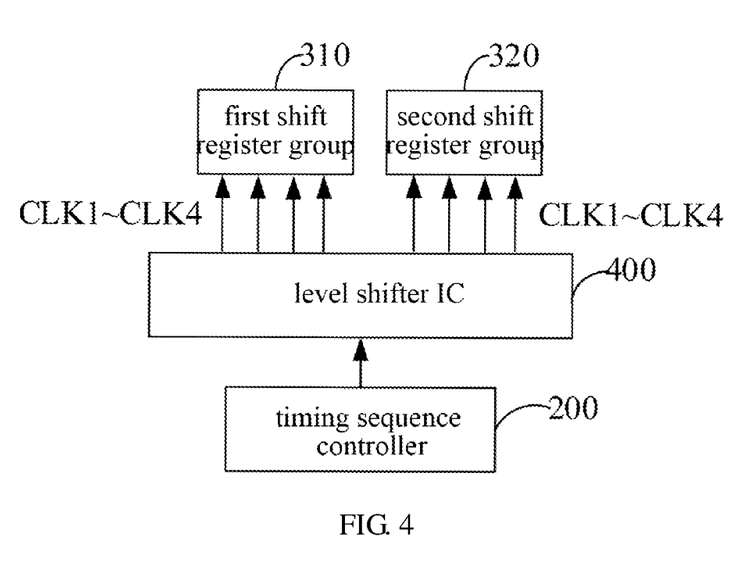
FIG. 4 is a functional module diagram of a level shifter of an embodiment according to the present disclosure.

Further, as shown in FIG. 4, FIG. 4 is a functional module diagram of a level shifter of an embodiment according to the present disclosure. The present disclosure further provides a level shifter 400, which includes the gate driver circuit 100 as described above.

It should be noted that, GOA circuit is a circuit that divides the original Gate IC into two parts of a level shifter 400 and a shift register. The level shifter 400 is disposed on the driver board, and the shift register is on the panel. The level shifter 400 transmits CLK to the shift register to complete driving, so as to simplify the Gate IC structure, further reducing the boarder length. Therefore, the potential unit 110 in the gate driver circuit 100 could serve as a potential shifter IC 400 independently, or, the potential enhancing unit 110, the current detecting unit 130, the switch unit 140 and the control unit 120 are integrated in the level shifter 400, further reducing the boarder length. In this embodiment, the second way is adopted, namely, the potential enhancing unit 110, the current detecting unit 130, the switch unit 140 and the control unit 120 are integrated in the level shifter 400.

The present disclosure further provides a display apparatus, the display apparatus includes a level shifter 400. The specific structure of the level shifter 400 is described with reference to the above embodiments. All the beneficial effects of the technical solutions of the above embodiments are achieved because the display apparatus adopts all the technical solutions of all the above embodiments, which will not be described in detail herein.

The foregoing description merely portrays some illustrative embodiments in accordance with the disclosure and therefore is not intended to limit the patentable scope of the disclosure. Any equivalent structure or flow transformations that are made taking advantage of the specification and accompanying drawings of the disclosure and any direct or indirect applications thereof in other related technical fields shall all fall in the scope of protection of the disclosure.

What is claimed is:

1. A gate driver circuit, comprising a potential enhancing unit, a switch unit, a current detecting unit and a control unit:

the potential enhancing unit, configured to divide a clock signal output by a timing sequence controller into two clock signal groups after the clock signal being potential enhanced by the potential enhancing unit, and correspondingly output the two clock signal groups to two shift register groups on a display panel, to drive the display panel to work; the two clock signal groups respectively comprising sub-clock signals;

the switch unit, connected in series between the potential enhancing unit and the shift registers located at both ends of the display panel, and configured to correspondingly switch on or off according to a control signal received, to control to output or stop outputting the clock signal groups;

the current detecting unit, connected in series between the potential enhancing unit and the switch unit, or connected in series between the switch unit and the shift registers located at both ends of the display panel, configured to respectively detect output current of each sub-clock signal in the two clock signal groups, and feed back a plurality of current signals to the control unit; and the control unit, configured to receive the plurality of current signals output by the current detecting unit, and compare current values corresponding to the plurality of current signals with a preset current threshold respectively, in response to a determination that the current value of any one of the sub-clock signals in one of the clock signal groups is less than the preset current threshold, output a control signal to the switch unit, to control the switch unit to cut off the output of the clock signal group.

2. The gate driver circuit of claim 1, wherein, a signal input end of the potential enhancing unit connects to a signal output end of the timing sequence controller, a signal output end of the potential enhancing unit connects to a signal input end of the current detecting unit, a signal output end of the current detecting unit connects to a signal input end of the switch unit, a first signal output end of the switch unit connects to a signal input end of the first shift register group of the display panel, a second signal output end of the switch unit connects to a signal input end of the second shift register group of the display panel, a controlled end of the potential enhancing unit, the signal output end of the current detecting unit, and a controlled end of the switch unit all connect to a signal end of the control unit.

3. The gate driver circuit of claim 1, wherein, the switch unit comprises a first sub-switch unit and a second sub-switch unit, the potential enhancing unit output two identical clock signal groups to the shift register at both ends of the display panel, respectively via the first sub-switch unit and the second sub-switch unit, the controlled end of the first sub-switch unit and the controlled end of the second sub-switch unit both connect to a control end of the control unit.

4. The gate driver circuit of claim 1, wherein, the switch unit comprises a plurality of sub-switch units, each of sub-clock signals is output to the shift registers via each of the sub-switch units, and the controlled end of each of the sub-switch units respectively connects to a control end of the control unit.

5. The gate driver circuit of claim 4, wherein, the plurality of sub-switch units defined between the current detecting unit and the first shift register are controlled to be on or off synchronously, and the plurality of sub-switch units defined between the current detecting unit and the second shift register are controlled to be on or off synchronously.

6. The gate driver circuit of claim 4, wherein, each of the sub-switch units is a metal-oxide semiconductor field effect transistor.

7. The gate driver circuit of claim 4, wherein, each of the sub-switch units is a triode.

8. The gate driver circuit of claim 1, wherein, the current detecting unit comprises a plurality of sub-current detecting units, each of the sub-current detecting units respectively detects current of each of the sub-clock signals, and respectively feeds back current signal to the control unit.

9. A display apparatus, wherein, the display apparatus comprises a level shift IC, the level shift IC comprises a gate driver circuit as claimed in claim 1.

10. A level shifter, wherein, the level shifter comprises a gate driver circuit, the gate driver circuit comprises a potential enhancing unit, a switch unit, a current detecting unit and a control unit:

the potential enhancing unit, configured to divide a clock signal output by a timing sequence controller into two clock signal groups after the clock signal being potential enhanced by the potential enhancing unit, and correspondingly output the two clock signal groups to two shift register groups on a display panel, to drive the display panel to work; the two clock signal groups respectively comprising sub-clock signals;

the switch unit, connected in series between the potential enhancing unit and the shift registers at both ends of the display panel, and configured to correspondingly switch on or off according to a control signal received, to control to output or stop outputting the clock signal groups;

the current detecting unit, connected in series between the potential enhancing unit and the switch unit, or in series between the switch unit and the shift registers at both ends of the display panel, configured to respectively detect output current of each sub-clock signal in the two clock signal groups, and feed back a plurality of current signals to the control unit; and the control unit, configured to receive the plurality of current signals output by the current detecting unit, and compare current values corresponding to the plurality of current signals with a preset current threshold respectively, in response to a determination that the current value of any one of the sub-clock signals in one of the clock signal groups is less than the preset current threshold, output a control signal to the switch unit, to control the switch unit to cut off the output of the clock signal group.

11. The level shifter of claim 10, wherein, a signal input end of the potential enhancing unit connects to a signal output end of the timing sequence controller, a signal output end of the potential enhancing unit connects to a signal input end of the current detecting unit, a signal output end of the current detecting unit connects to a signal input end of the switch unit, a first signal output end of the switch unit connects to a signal input end of the first shift register group of the display panel, a second signal output end of the switch unit connects to a signal input end of the second shift register group of the display panel, a controlled end of the potential enhancing unit, the signal output end of the current detecting unit, and a controlled end of the switch unit all connect to a signal end of the control unit.

12. The level shifter of claim 10, wherein, the switch unit comprises a first sub-switch unit and a second sub-switch unit, the potential enhancing unit output two identical clock signal groups to the shift register at both ends of the display panel, respectively via the first sub-switch unit and the second sub-switch unit, the controlled end of the first sub-switch unit and the controlled end of the second sub-switch unit both connect to a control end of the control unit.

13. The level shifter claim 10, wherein, the switch unit comprises a plurality of sub-switch units, each of sub-clock signals is output to the shift registers via each of the sub-switch units, and the controlled end of each of the sub-switch units respectively connects to a control end of the control unit.

14. The level shifter of claim 13, wherein, the plurality of sub-switch units defined between the current detecting unit and the first shift register are controlled to be on or off synchronously, and the plurality of sub-switch units defined between the current detecting unit and the second shift register are controlled to be on or off synchronously.

15. The level shifter of claim 13, wherein, each of the sub-switch units is a metal-oxide semiconductor field effect transistor.

16. The level shifter of claim 13, wherein, each of the sub-switch units is a triode.

17. The level shifter of claim 10, wherein, the current detecting unit comprises a plurality of sub-current detecting units, each of the sub-current detecting units respectively detects current of each of the sub-clock signals, and respectively feeds back current signal to the control unit.

18. The level shifter of claim 10, wherein, the potential enhancing unit, the current detecting unit, the switch unit, and the control unit are integrated in the level shifter.

* * * * *